(12) United States Patent
Machida et al.

(10) Patent No.: US 8,804,361 B2
(45) Date of Patent: Aug. 12, 2014

(54) WIRING SUBSTRATE

(71) Applicant: Shinko Electric Industries Co., Ltd., Nagano-ken (JP)

(72) Inventors: Takemi Machida, Nagano (JP); Daisuke Takizawa, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 14/050,505

(22) Filed: Oct. 10, 2013

(65) Prior Publication Data

US 2014/0104797 A1    Apr. 17, 2014

(30) Foreign Application Priority Data

Oct. 15, 2012    (JP) ................. 2012-228210

(51) Int. Cl.
*H05K 7/00* (2006.01)
*H05K 1/18* (2006.01)

(52) U.S. Cl.
CPC ..................... *H05K 1/181* (2013.01)
USPC ........... 361/760; 361/761; 361/748; 361/807; 361/763

(58) Field of Classification Search
USPC .......................... 361/760, 761, 748, 763, 807
See application file for complete search history.

(56) References Cited

U.S. PATENT DOCUMENTS

| | | | |
|---|---|---|---|
| 7,978,478 B2 * | 7/2011 | Inagaki et al. | 361/763 |
| 2002/0076919 A1 * | 6/2002 | Peters et al. | 438/637 |

FOREIGN PATENT DOCUMENTS

JP    2008-311275    12/2008

* cited by examiner

*Primary Examiner* — Andargie M Aychillhum
(74) *Attorney, Agent, or Firm* — Fish & Richardson P.C.

(57) ABSTRACT

A wiring substrate includes an electronic component and a core substrate. A through hole extends through the core substrate and accommodates the electronic component, which includes a main body and connection terminals. The main body includes opposing first side surfaces, opposing second side surfaces, and opposing third side surfaces. The connection terminals cover the first side surfaces. First projections project from walls of the through hole toward the first side surfaces. Each first projection includes a distal end that contacts one of the connection terminals. Second projections project from walls of the through hole toward the second side surfaces. The opposing second projections include distal ends spaced apart by a distance longer than the distance between the second side surfaces and shorter than the distance between two farthest points on a periphery of each first side surface.

13 Claims, 9 Drawing Sheets

Fig.7
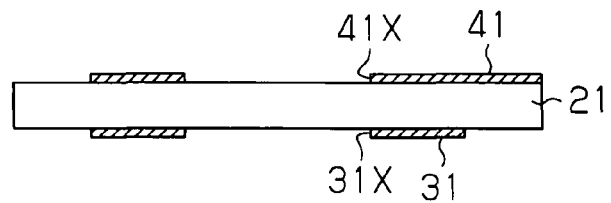
Fig.8A    Fig.8B
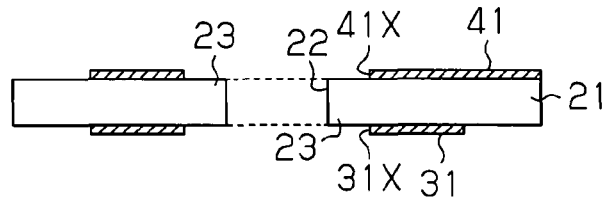    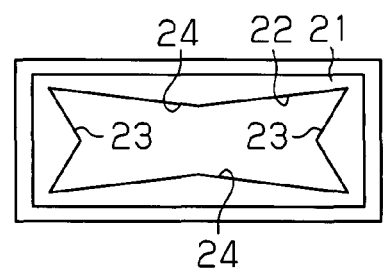
Fig.9A    Fig.9B
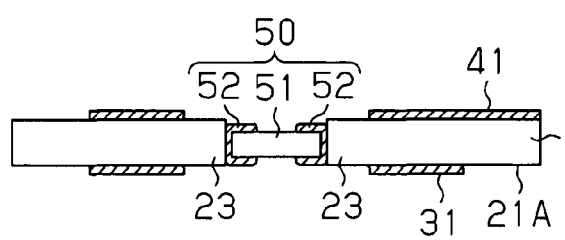    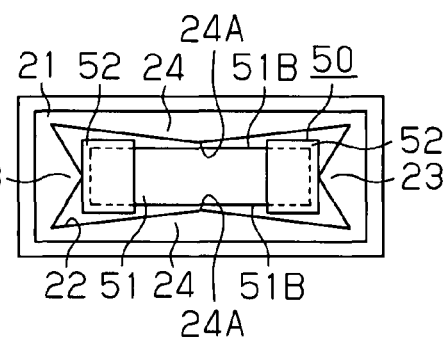

Fig.10
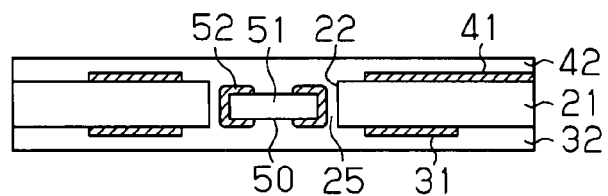
Fig.11A  Fig.11B
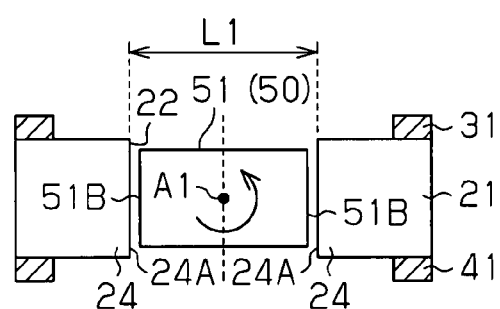 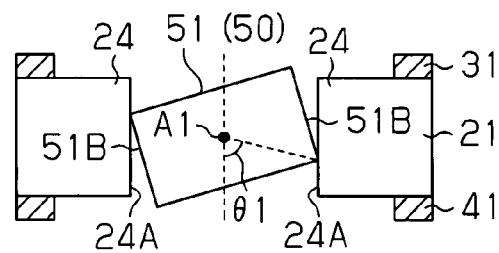
Fig.12
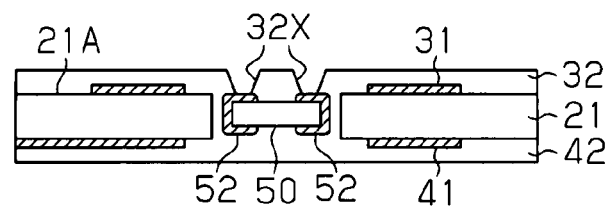

WIRING SUBSTRATE

CROSS-REFERENCE TO RELATED APPLICATIONS

This application is based upon and claims the benefit of priority from prior Japanese Patent Application No. 2012-228210, filed on Oct. 15, 2012, the entire contents of which are incorporated herein by reference.

FIELD

The present disclosure relates to a wiring substrate

BACKGROUND

Japanese Laid-Open Patent Publication No. 2008-311275 describes an example of a wiring substrate that incorporates an electronic component such as a chip-type capacitive element (chip capacitor).

SUMMARY

One aspect of the present invention is a wiring substrate including a core substrate, an electronic component, and an insulating material. The electronic component includes a main body and a plurality of connection terminals. The main body includes first side surfaces that are opposed to each other at two end surfaces in an x-direction of the main body, second side surfaces that are opposed to each other at two end surfaces in a y-direction of the main body orthogonal to the x-direction, and third side surfaces that are opposed to each other at two end surfaces in a z-direction of the main body orthogonal to both of the x-direction and the y-direction. The connection terminals respectively cover the first side surfaces. The core substrate includes a first surface, a second surface opposite to the first surface, a through hole in which the electronic component is arranged, the through hole extending from the first surface to the second surface, a plurality of first projections respectively projecting from walls of the through hole facing the first side surfaces of the main body toward the first side surfaces of the main body, and a plurality of second projections projecting from walls of the through hole facing the second side surfaces of the main body toward the second side surfaces of the main body. Each of the first projections includes a distal end that contacts a corresponding one of the connection terminals to support the electronic component. The insulating material is filled between the electronic component and the walls of the through hole. Opposing ones of the second projections respectively include distal ends that are spaced apart by a distance that is longer than a distance between the second side surfaces and shorter than a distance between two farthest points on a periphery of each first side surface.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 7 is a schematic cross-sectional view illustrating one step in a method for manufacturing the wiring substrate;

FIGS. 8A and 8B are respectively a cross-sectional view and a plan view illustrating one step in a method for manufacturing the wiring substrate;

FIGS. 9A and 9B are respectively a cross-sectional view and a plan view illustrating one step in a method for manufacturing the wiring substrate;

FIG. 10 is a schematic cross-sectional view illustrating one step in a method for manufacturing the wiring substrate;

FIGS. 11A and 11B are diagrams illustrating a structure for reducing rotation of the chip capacitor;

FIG. 12 is a cross-sectional view illustrating one step in a method for manufacturing the wiring substrate;

DETAILED DESCRIPTION OF EMBODIMENTS

Figure 22:
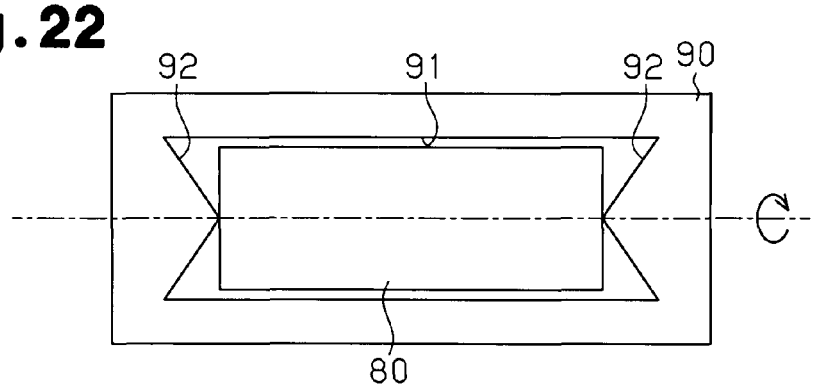
FIG. 22 is a schematic plan view illustrating a core substrate of a wiring substrate in a referential example.

A wiring substrate according to a referential example is illustrated in FIG. 22. In the referential example, a core substrate 90 of the wiring substrate includes a through hole 91 that receives an electronic component 80. Two conical projections 92 project from the wall of the through hole 91 to support the electronic component 80 at two points. Manufacturing errors in the conical projections 92 or the electronic component 80 may weaken the support of the electronic component 80 by the projection 92. In such a case, the electronic component 80 may rotate in the direction indicated by the arrow in FIG. 22 about a hypothetical axis connecting the distal ends of the two conical projections 92.

One embodiment will now be described with reference to the drawings.

In the accompanying drawings, elements in the drawings are illustrated for simplicity and clarity and have not necessarily been drawn to scale. In the cross-sectional views, hatching lines may have been removed to aid understanding of the cross-sectional structure.

Figure 1:
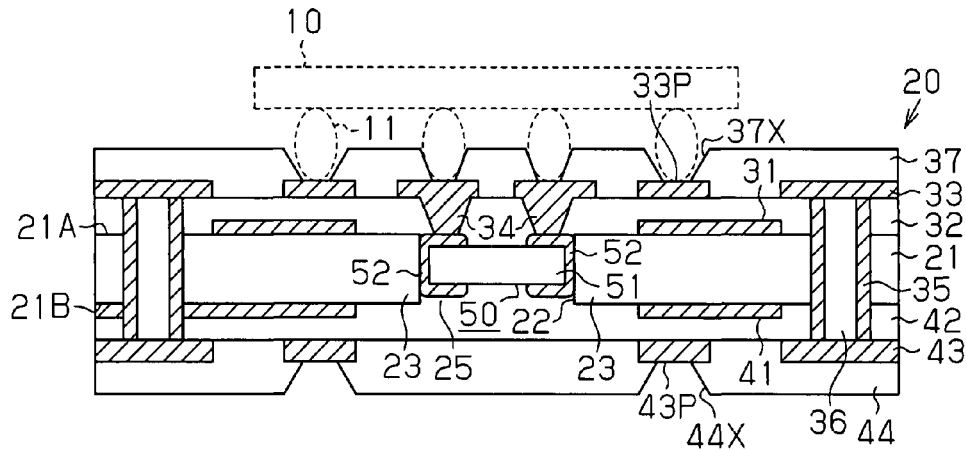
FIG. 1 is a schematic cross-sectional view illustrating one embodiment of a wiring substrate taken along line 1-1 in FIG. 3.
Figure 2:
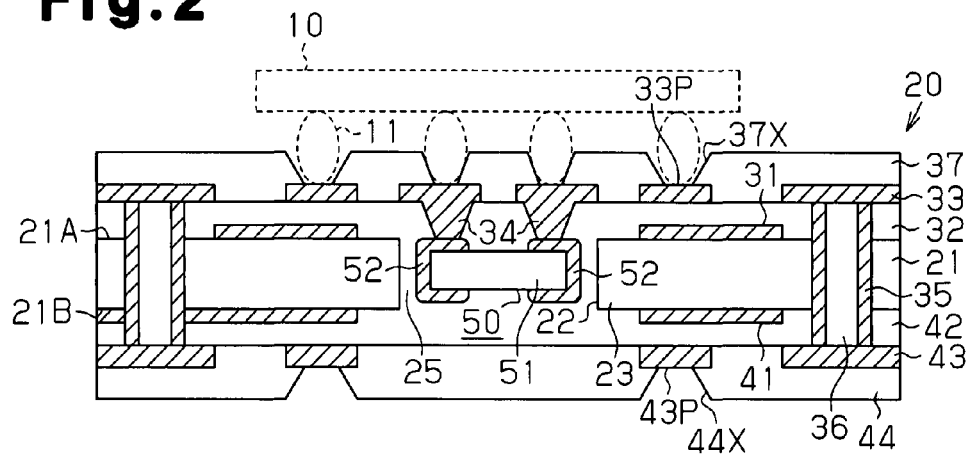
FIG. 2 is a schematic cross-sectional view illustrating the wiring substrate taken along line 2-2 in FIG. 3.

As illustrated in FIGS. 1 and 2, an electronic device includes a semiconductor chip 10 and a wiring substrate 20. The semiconductor chip 10 is mounted on an upper surface of the wiring substrate 20. The wiring substrate 20 is mounted on a mounting substrate such as a motherboard. The wiring substrate 20 may also be used for a semiconductor package to mount a chip such as a CPU.

The wiring substrate 20 includes a core substrate 21. The core substrate 21 is, for example, a glass epoxy substrate that impregnates a glass cloth (glass woven cloth), which is a reinforcement material, with a thermosetting insulative resin of which the main component is epoxy resin. The reinforcement material is not limited to glass cloth and may be, for example, a glass non-woven cloth, an aramid woven cloth, an aramid non-woven cloth, a liquid crystal polymer (LCP) woven cloth, and an LCP non-woven cloth may be used. The thermosetting insulative resin is not limited to epoxy resin and may be, for example, an insulative resin such as polyimide resin and cyanate resin.

Figure 3:
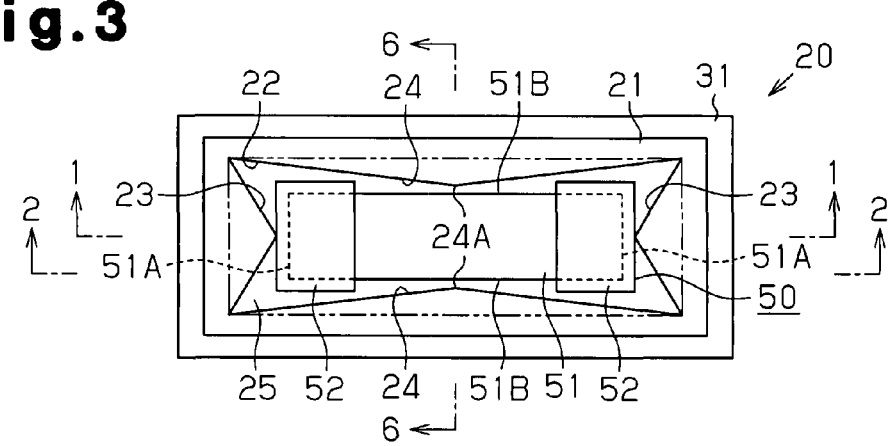
FIG. 3 is a partially enlarged plan view of a core substrate.

A through hole 22 extends through the core substrate 21 between an upper surface 21A (first surface) and a lower surface 21B (second surface). As illustrated in FIG. 3, the through hole 22 is tetragonal as viewed from above. FIG. 3 illustrates the tetragonal portion of the core substrate 21 where the through hole 22 is formed in an enlarged manner. The through hole 22 may be referred to as an elongated accommodation compartment having openings in the upper surface 21A and the lower surface 21B.

A chip capacitor 50 is arranged in the through hole 22. The chip capacitor 50 serves as an electronic component.

Figure 4:
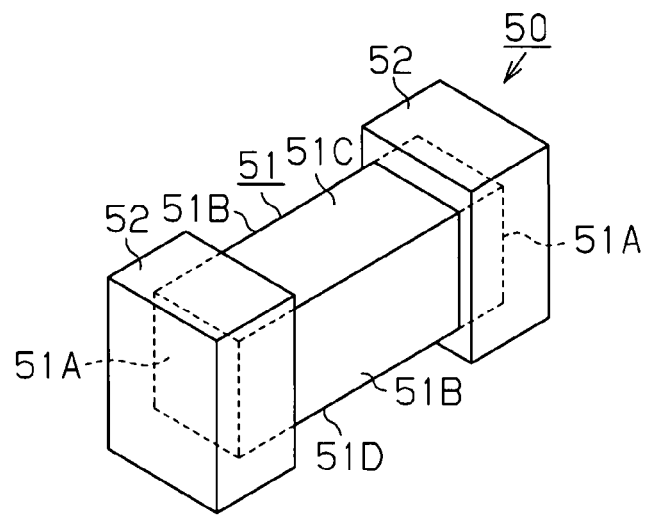
FIG. 4 is a schematic perspective view of a chip capacitor.

FIG. 4 illustrates an elongated chip capacitor 50. The chip capacitor 50 includes a capacitor body 51 shaped in a rectangular cuboid and connection terminals 52 arranged on two ends of the capacitor body 51 in a longitudinal direction of the capacitor body 51. In the illustrated example, the capacitor body 51 includes first side surfaces 51A at two end surfaces in the longitudinal direction of the capacitor body 51, second side surfaces 51B at two end surfaces in a lateral direction (width direction) of the capacitor body 51 orthogonal to the longitudinal direction, and third side surfaces, or upper and lower surfaces 51C and 51D, at two end surfaces in a vertical direction (thickness direction) of the capacitor body 51 orthogonal to both of the longitudinal direction and the lateral direction. The upper and lower surfaces 51C and 51D are orthogonal to the side surfaces 51A and 51B. The longitudinal direction, the lateral direction and the vertical direction of the capacitor body 51 may be referred to as x, y and z directions in a three dimensional Cartesian coordinate system, respectively. Each connection terminal 52 entirely covers at least the corresponding first side surfaces 51A of the capacitor body 51. In the illustrated example, each connection terminal 52 covers the entire corresponding first side surface 51A of the capacitor body 51, a portion of each second side surface 51B, a portion of the upper surface 51C, and a portion of the lower surface 51D. The capacitor body 51 is, for example, formed by mainly ceramic and an electrode, such as copper or the like. The material of the connection terminal 52 may be, for example, copper or copper alloy. The capacitor body 51 may have a size of, for example, about 1000 μm×500 μm as viewed from above. The capacitor body 51 may have a thickness of, for example, about 150 μm to 600 μm. The connection terminal 52 may have a thickness of, for example, about 50 μm.

As illustrated in FIG. 3, the core substrate 21 includes two projections 23 projecting from the wall of the through hole 22 facing the end surfaces in the longitudinal direction of the chip capacitor 50 (side surfaces 51A of the capacitor body 51). The two projections 23 are respectively formed on two opposing walls of the through hole 22. Each projection 23 may have the shape of a triangular prism, with the corresponding tetragonal short side of the through hole 22 forming one of the three faces of the triangular prism. The projections 23 projects from the walls of the through hole 22 toward the connection terminals 52 covering the side surfaces 51A of the capacitor body 51. Each projection 23 has a distal end that contacts the opposing connection terminal 52. The distance between the distal ends of the two projections 23 is set to be substantially the same as or slightly shorter than the length of the chip capacitor 50 (distance between the two connection terminals 52). In the description hereafter, the distance between the distal ends of the two projections 23 refers to the length of the chip capacitor 50 (capacitor body 51) between the distal ends of the two projections 23. The projections 23 support the chip capacitor 50 in the through hole 22. Thus, the chip capacitor 50 is supported by the projections 23 only at the two locations of the connection terminal 52.

The length of the long side of the through hole 22 is, for example, about 1100 to 1200 μm. The distance between the distal ends of the projections 23 is, for example, about 900 to 1000 μm. The length of the chip capacitor 50 in the longitudinal direction is, for example, about 950 to 1050 μm.

Figure 5:
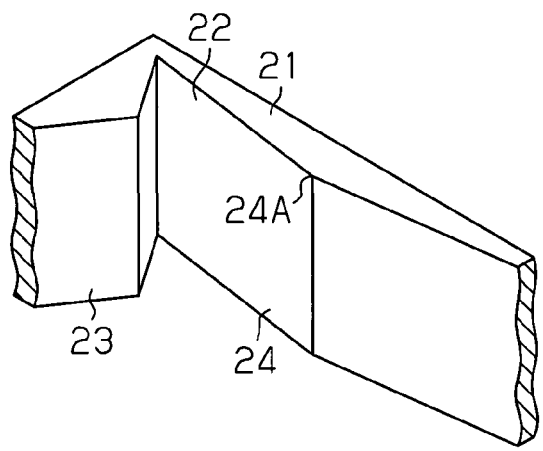
FIG. 5 is a perspective view of a projection projecting into a through hole.

As illustrated in FIG. 5, the distal end of each projection 23 continuously extends from the upper surface 21A to the lower surface 21B in the core substrate 21. The distal end of each projection 23 extends straight in the thicknesswise direction of the core substrate 21 and comes into linear contact with the corresponding connection terminal 52 of the chip capacitor 50.

As illustrated in FIG. 3, the core substrate 21 further includes two projections 24. The two projections 24 are formed on the walls of the through hole 22 opposing the two longitudinal side surfaces of the chip capacitor 50, that is, the side surfaces 51B of the capacitor body 51. The projections 24 are formed on the opposing walls of the through hole 22. Each projection 24 may have the shape of a triangular prism, with the corresponding tetragonal long side of the through hole 22 forming one of the three faces of the triangular prism. The projections 24 project from the walls of the through hole 22 toward the exposed side surface 51B of the capacitor body 51 that are not covered by the connection terminals 52.

Figure 6:
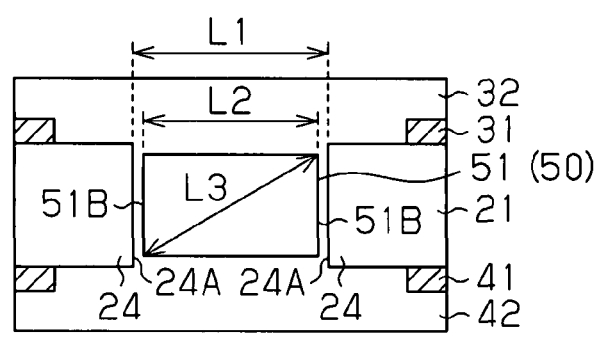
FIG. 6 is a schematic cross-sectional view of the wiring substrate taken along line 6-6 in FIG. 3.

As illustrated in FIG. 6, a distance L1 between distal ends 24A of the two projections 24 is set to be longer than a distance between the side surfaces 51B of the capacitor body 51 (width of the capacitor body 51) L2. In the present specification, the distance between the distal ends 24A of the two projections 24 refers to the distance between the distal ends 24A of the projections 24 in a lateral direction orthogonal to the longitudinal direction of the chip capacitor 50 (capacitor body 51), that is, in a direction parallel to the side surfaces 51A. In the illustrated example, the distal ends 24A of the projections 24 do not contact the opposing side surface 51B of the capacitor body 51. The distance L1 between the distal ends 24A of the two projections 24 is set to be shorter than the longest distance L3 between two points of the capacitor body 51 in a cross-section orthogonal to the longitudinal direction (length of a diagonal line between the side surfaces 51A). As illustrated in FIG. 5, the distal end 24A of the projection 24 continuously extends from the upper surface 21A toward the lower surface 21B in the core substrate 21.

The distance L1 is preferably set to be longer than the distance L2 by 10% to 20%. For example, the distance L1 may be set to about 550 μm, and the distance L2 may be set to about 500 μm.

The projections 23 and 24 are made from the same material as the core substrate 21, that is, cured resin. Further, the projections 23 and 24 include a reinforcement material such as a glass cloth.

As illustrated in FIG. 2, the through hole 22 is filled with an insulating material 25. The insulating material 25 is formed by a resin having a viscosity that allows for the resin to be filled in the through hole 22. The resin is filled in the through hole 22 and then cured. An insulative resin such as an epoxy resin, a polyimide resin, an acrylic resin, and the like may be used to form the insulating material 25.

As illustrated in FIGS. 1 and 2, a wiring layer 31, an insulating layer 32 (first insulating layer), and a wiring layer 33 are formed in this order on the upper surface side of the core substrate 21. In the same manner, a wiring layer 41, an insulating layer 42 (second insulating layer), and a wiring layer 43 are formed in this order on a lower surface side of the core substrate 21. A pattern of a portion of the wiring layer 31 is connected to the connection terminals 52 of the chip capacitor 50 through vias 34 extending through the insulating layer 32. Patterns of portions of the wiring layers 31, 33, 41, and 43 are electrically connected to one another by through holes 35 extending through the core substrate 21 and the insulating layers 32 and 42. The through holes 35 may include tubular conductors. An insulating material 36 is filled in each through hole 35. The insulating material 36 is formed by filling the through hole 35 with a resin having a viscosity allowing for the resin to fill the through hole 35 and curing the resin. Although not illustrated in the drawings, patterns of portions of the wiring layer 31 and the wiring layer 33 are connected to each other by vias extending through the insulating layer 32, and patterns of portions of the wiring layer 41 and the wiring layer 43 are connected to each other through vias extending through the insulating layer 42. The wiring layer 31 and the wiring layer 41 formed on the two opposite surfaces of the core substrate 21 may be electrically connected by through electrodes formed in the core substrate 21.

Copper and copper alloy, for example, may be used to form the wiring layers 31, 33, 41, and 43. An insulative resin such as an epoxy resin, a polyimide resin, an acrylic resin, and the like may be used to form the insulating layers 32 and 42 and the insulating material 36.

A solder resist layer 37 covers the insulating layer 32 and the wiring layer 33. The solder resist layer 37 includes openings 37X for exposing portions of the wiring layer 33 as connection pads 33P.

The insulating layer 42 and the wiring layer 43 are covered by a solder resist layer 44. The solder resist layer 44 includes openings 44X. Portions of the wiring layer 43 are exposed from the openings 44X to function as external connection pads 43P.

An insulative resin such as an epoxy resin, an acrylic resin, and the like may be used as the material of the solder resist layers 37 and 44.

The semiconductor chip 10 includes bumps 11 that are connected to the pads 33P. Therefore, the semiconductor chip 10 is connected to the chip capacitor 50 by the bumps 11, the pads 33P (wiring layer 33), and the vias 34. Although not illustrated in the drawings, the pads 43P are connected to a mounting substrate such as a motherboard and the like by external connection terminals (e.g., solder balls).

A method for manufacturing the wiring substrate 20 will now be described.

As illustrated in FIG. 7, metal foils formed on the upper surface and the lower surface of the core substrate 21 are etched and patterned to form the wiring layers 31 and 41. This forms openings 31X and 41X are formed in the wiring layers 31 and 41 in correspondence with the through hole 22 illustrated in FIG. 1.

Then, as illustrated in FIGS. 8A and 8B, the through hole 22 and the projections 23 and 24 are formed in the core substrate 21. The through hole 22 and the projections 23 and 24 may be formed by using, for example, a pressing machine or a laser processing machine.

Then, as illustrated in FIGS. 9A and 9B, the chip capacitor 50 is inserted into the through hole 22 of the core substrate 21. Here, the chip capacitor 50 is inserted into the through hole 22 so that each connection terminal 52 of the chip capacitor 50 comes into contact with the distal end of the corresponding projection 23. As illustrated in FIG. 9B, each projection 24 does not contact the chip capacitor 50 (specifically, the side surface 51B of the capacitor body 51 facing the projection 24), and the distal end of each projection 24 is spaced apart from the chip capacitor 50 by a regulated distance. The chip capacitor 50 inserted into the through hole 22 in this manner is supported only by the two projections 23. In the step of inserting the chip capacitor 50, the core substrate 21 may be placed on a jig having a flat reference surface, and the chip capacitor 50 inserted into the through hole 22 may be forced against the reference surface. In this case, the projections 23 support the chip capacitor 50 so as to suppress tilting of the chip capacitor 50. The chip capacitor 50 may be arranged so that the main surface of the connection terminal 52 of the chip capacitor 50 (exposed surface of the chip capacitor 50 arranged in the through hole 22) is parallel (substantially flush) to the upper surface 21A (first surface) of the core substrate 21 as viewed in FIG. 1.

As illustrated in FIG. 10, the insulating layers 32 and 42 are formed on the upper and lower surfaces of the core substrate 21. For example, the upper and lower surfaces of the core substrate 21 and the chip capacitor 50 are covered with resin films. In the illustrated example, the resin films are formed from a thermosetting resin. The resin film is, for example, in a B-stage state (half-cured state). A pressing machine or the like presses the resin films toward the core substrate 21 under a depressurized (vacuum) atmosphere to fill resin between the walls of the through hole 22 and the chip capacitor 50. In this case, when pressure is applied to the chip capacitor 50 to force the resin into the through hole 22, the chip capacitor 50 may rotate in the through hole 22 since the chip capacitor 50 is supported by only the two projections 23. For example, referring to FIG. 11A, the chip capacitor 50 may rotate in the through hole 22 about a hypothetical rotation axis A1 lying at substantially the center of the chip capacitor 50 (capacitor body 51) in the thicknesswise direction. However, the distance L1 between the distal ends 24A of two projections 24 is set to be shorter than the length of the diagonal line, that is, the longest distance L3 (FIG. 6) between two points in a cross-section orthogonal to the longitudinal direction of the capacitor body 51. Thus, as illustrated in FIG. 11B, the capacitor body 51 engages with the distal end 24A of the projection 24 as the chip capacitor 50 rotates. The engagement stops rotation of the chip capacitor 50. In other words, the projections 24 formed on the inner surface of the through hole 22 may suppress rotation of the chip capacitor 50. This suppresses displacement (tilting) of the chip capacitor 50.

Then, a heating process is performed to cure the resin and form the insulating material 25 and the insulating layers 32 and 42.

Next, as illustrated in FIG. 12, openings 32X are formed in the insulating layer 32 to expose portions of the connection terminals 52 of the chip capacitor 50. As illustrated in FIG. 12 the core substrate 21 is reversed upside down after the step illustrated in FIG. 10. The openings 32X are formed by, for example, a laser processing machine. Here, the projections 24 suppress rotation of the chip capacitor 50 (FIG. 11), as described above. Thus, the main surface (upper surface) of each connection terminal 52 of the chip capacitor 50 remains substantially parallel to the upper surface 21A of the core substrate 21. Accordingly, the insulating layers 32, which cover the connection terminals 52, are formed to have the desired thickness (e.g., design value) or with a small errors from the desired thickness. Thus, the openings 32X may be formed to ensure exposure of the upper surfaces of the connection terminals 52. This ensures connection of the vias 34 (FIG. 1), which are formed in the next step, to the connection terminals 52.

Although not illustrated in the drawings, the vias 34 and the wiring layers 33 and 43 may be formed by any of various types of wiring formation processes such as a semi-additive process and a subtractive process. The through holes 35 may be formed by performing non-electrolytic plating or electrolytic plating on through hole formed by a laser processing machine or a drilling machine. Then, for example, a photosensitive resin film is patterned into a predetermined shape to form the solder resist layers 37 and 44.

The operation of the wiring substrate 20 will now be described.

The two projections 24 project from the opposing walls of the through hole 22 toward the exposed side surfaces 51B of the capacitor body 51 that are not covered by the connection terminals 52 of the chip capacitor 50. The distance L1 between the distal ends 24A of the two projections 24 is set to be longer than the distance L2 between the side surfaces 51B of the capacitor body 51. Therefore, when the upper surfaces of the connection terminals 52 are substantially parallel to the upper surface 21A of the core substrate 21, the capacitor body 51 does not contact the projections 24. Thus, the projections 24 do not apply stress to the capacitor body 51 that would be produced when supporting the chip capacitor 50. This suppresses damages such as cracks to the capacitor body 51. The distance L1 between the distal ends 24A of the two projections 24 is set to be shorter than the length of the diagonal line, that is, the longest distance L3 between two points in a cross-section (side surface 51A) orthogonal to the longitudinal direction of the capacitor body 51. Thus, even when the chip capacitor 50 starts to rotate in the through hole 22, the capacitor body 51 engages the distal ends 24A of the projections 24 as the capacitor body 51 rotates. This stops the rotation of the chip capacitor 50. More specifically, when the upper surfaces of the connection terminals 52 of the chip capacitor 50 in the through hole 22 are exposed from the open end in the upper surface of the core substrate 21, the two projections 24 stop the rotation of the chip capacitor 50. Since rotation of the chip capacitor 50 is suppressed, connection failures of the vias 34 relative to the connection terminals 52 that may be caused by rotation of the capacitor 50 are reduced.

Generally, the dimensional errors in the capacitor body 51 are smaller than the dimensional errors in the connection terminals 52. Thus, even when the projection 24 and the capacitor body 51 include dimensional errors, the capacitor body 51 subtly comes into contact with the projections 24 as long as the capacitor body 51 is not rotated. The projections 24, which restrict rotation, projects toward the capacitor body 51, which has a relatively small dimensional error, but does not project toward the connection terminals 52, which have relatively large dimensional errors. This suppresses unnecessary contact of the chip capacitor 50 (capacitor body 51) with the projections 24.

The present embodiment has the following effects.

(1) The two projections 24 are formed on the walls of the through hole 22 and project toward the exposed side surfaces 51B of the capacitor body 51 that are not covered by the connection terminals 52. The distance L1 between the distal ends 24A of the two projections 24 is set to be longer than the distance L2 between the side surfaces 51B of the capacitor body 51. Further, the distance L1 is set to be shorter than the length of the diagonal line, that is, the longest distance L3 between the side surfaces 51A of the capacitor body 51. This suppresses rotation of the chip capacitor 50 in the through hole 22, while suppressing the damages such as cracks in the capacitor body 51.

(2) Each projection 24 continuously extends in the thicknesswise direction of the core substrate 21. This structure decreases the rotatable angle and the displacement amount of the chip capacitor 50 as compared to a referential example in which the projections 24 are formed on a portion of the core substrate 21 in the thicknesswise direction.

(3) The distal end of each projection 23 continuously extends along the thicknesswise direction of the core substrate 21. The distal end of the projection 23 that extends straight in the thicknesswise direction of the core substrate 21 contacts the side surface of the corresponding connection terminal 52. This structure supports the chip capacitor 50 with the projections 23 in a more preferable manner as compared with a referential example in which the projections 23 are formed on a portion of the core substrate 21 in the thicknesswise direction.

(4) The wiring substrate of a referential example is manufactured in the following manner. First, a core substrate including a larger through hole than the electronic component is prepared. A temporary fastening tape is adhered to one side of the core substrate to close the through hole. An electronic component is arranged in the through hole from the open side of the core substrate that is not closed by the temporary fastening tape, and the electronic component is temporary fastened to the temporary fastening tape. An insulating layer is then formed on the surface of the core substrate that is free from the temporary fastening tape to fix the electronic component. Then, the temporary fastening tape is removed. However, when the insulating layer is formed with the temporary fastening tape adhered to the core substrate, the temporary fastening tape may be strongly adhered to the core substrate due to the pressure applied when forming the insulating layer. Thus, the adhesive or the like of the temporary fastening tape may remain on the core substrate when the temporary fastening tape is removed from the core substrate.

However, in the method for manufacturing the wiring substrate of the present embodiment, the projections 23 projecting into the through hole 22 support the chip capacitor 50. Since there is no need for a temporary fastening tape that holds the chip capacitor 50 in the through hole 22, the adhesive or the like of a temporary fastening tape would not remain on the core substrate 21. Further, residual adhesive may cause warping of the wiring substrate 20 and defoliation of the insulating layers 32 and 42 and the like. Since there is no residual adhesive, such warping and defoliation are suppressed.

It should be apparent to those skilled in the art that the present invention may be embodied in many other specific forms without departing from the spirit or scope of the invention. Particularly, it should be understood that the present invention may be embodied in the following forms.

Figure 13:
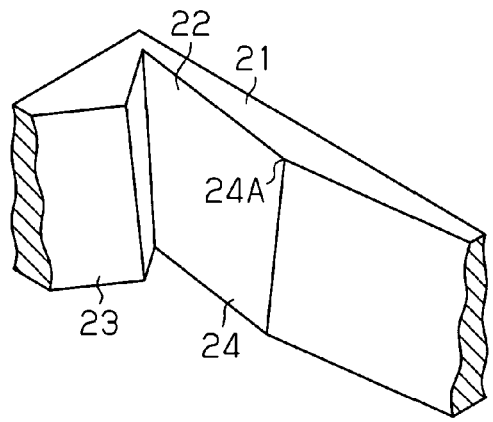
FIG. 13 is a perspective view illustrating a projection in a first modification.

The shape of the projections 23 in the above embodiment may be changed. For example, as illustrated in FIG. 13, the distance between the distal end of each projection 23 and the opposing connection terminal 52 (FIG. 3) may be gradually varied in the thicknesswise direction of the core substrate 21. In the example illustrated in FIG. 14, the distance between the distal ends of the two projections 23 gradually increases from the upper surface 21A toward the lower surface 21B of the core substrate 21. This structure facilitates insertion of the chip capacitor 50 into the through hole 22. This allows for the chip capacitor 50 to be inserted into the through hole 22 with a relatively weak pushing force. Further, the stress applied to the capacitor body 51 of the chip capacitor 50 becomes small, and damage of the capacitor body 51 may be suppressed.

Figure 14:
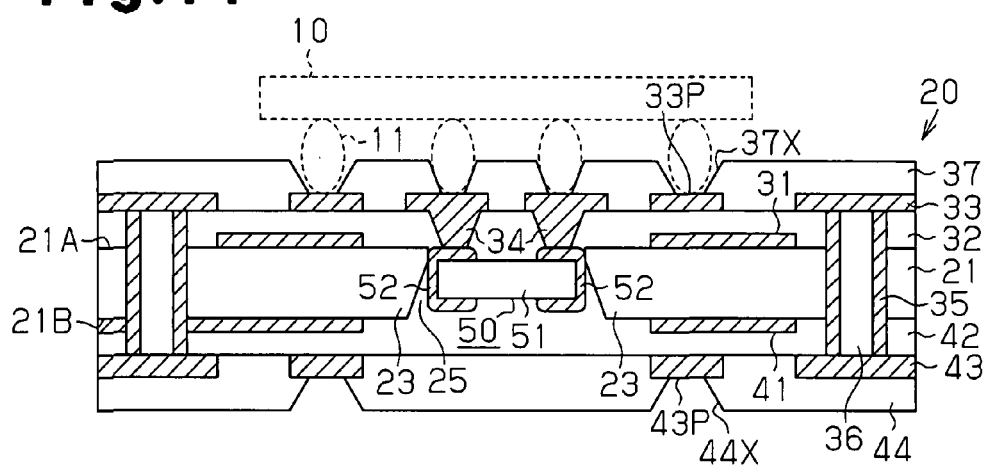
FIG. 14 is a cross-sectional view of a wiring substrate in the first modification.
Figure 15A:
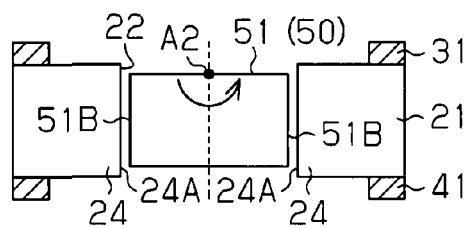
FIGS. 15A and 15B are diagrams illustrating a structure for reducing rotation of the chip capacitor in the first modification.
Figure 15B:
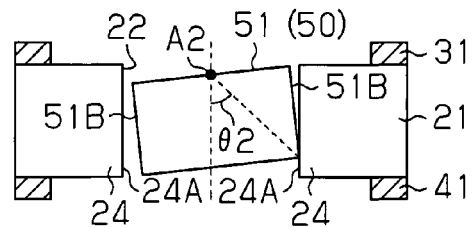

In the example of FIG. 14, a narrowest portion where the distance between the distal ends of the pair of projections 23 is the smallest is formed at the upper side of the core substrate 21, and the chip capacitor 50 is held by the distal ends of the two projections 23 at the narrowest portion. As illustrated in FIG. 15A, a hypothetical rotation axis A2 of the chip capacitor 50 is moved from the center of the chip capacitor 50 (FIG. 11A) in the thicknesswise direction toward the surface (e.g., upper surface) of the chip capacitor 50. As a result, as illustrated in FIG. 15B, a rotatable angle θ2 of the chip capacitor 50 in the through hole 22 becomes smaller than a rotatable angle θ1 in the example of FIG. 11B. Thus, the rotation and displacement amount of the chip capacitor 50 can be reduced as the hypothetical rotation axis A2 becomes closer to the surface (upper surface or lower surface) of the chip capacitor 50.

Each projection 24 is not limited to the shape of a substantially triangular prism as viewed from above. The shape may be changed as long as the rotation of the chip capacitor 50 can be stopped. For example, as illustrated in FIG. 13, the distance between the distal end of each projection 24 of each projection 24 and the opposing capacitor body 51 (FIG. 3) may gradually vary in the thicknesswise direction of the core substrate 21.

Figure 16A:
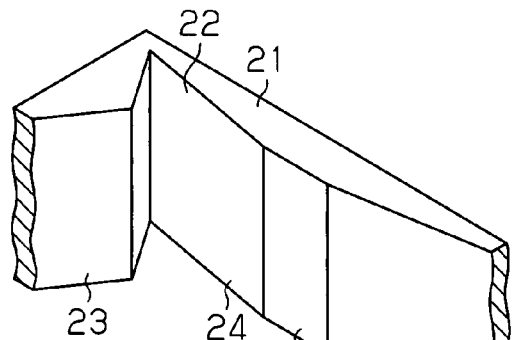
FIG. 16A is a schematic perspective view illustrating a projection in a second modification.
Figure 16B:
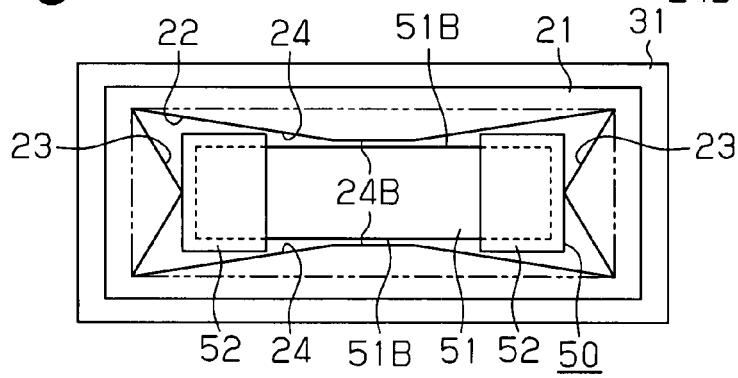
FIG. 16B is a partially enlarged plan view of a core substrate in the second modification.

For example, as illustrated in FIGS. 16A and 16B, each projection 24 may have a substantially trapezoidal shape as viewed from above with a tetragonal base (lower bottom) formed by the long side of the through hole 22. Each projection 24 has a flat distal end surface 24B. The flat distal end surface 24B faces the corresponding side surface 51B of the capacitor body 51. When the chip capacitor 50 rotates, the capacitor body 51 comes into contact with the distal end surface 24B of the projection 24. This structure increases the area of contacting between the capacitor body 51 and the projection 24. Thus, the stress or the like applied to the capacitor body 51 is reduced, and damage of the capacitor body 51 can be suppressed.

Figure 17A:
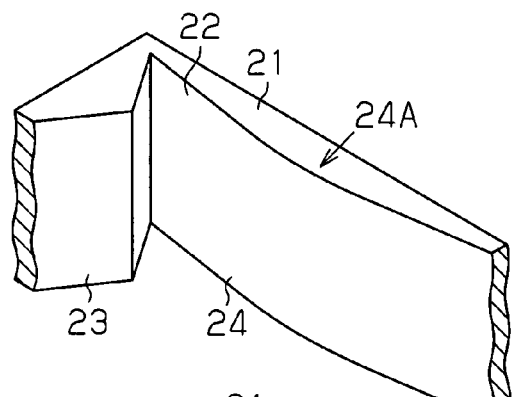
FIG. 17A is a schematic perspective view illustrating a projection in a third modification.
Figure 17B:
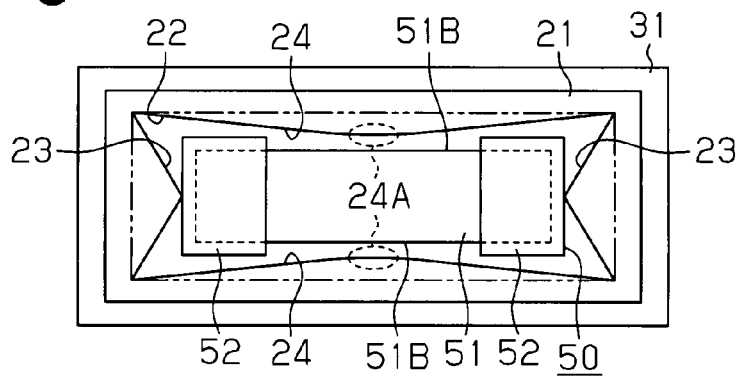
FIG. 17B is a partially enlarged plan view of a core substrate in the third modification.

As illustrated in FIGS. 17A and 17B, each projection 24 may have a curved distal end 24A. Each projection 24 may entirely be formed to have a substantially arcuate shape as viewed from above. Alternatively, the vicinity of the distal end of each projection 24 may be curved. In either case, each projection 24 may have a chamfered distal end 24A. When the chip capacitor 50 rotates, the capacitor body 51 comes into contact with the chamfered distal end 24A of the projection 24. This increases the area of contacting between the capacitor body 51 and the projection 24 suppresses damage of the capacitor body 51. Further, local contact of the capacitor body 51 with the chamfered distal end 24A is avoided, and the capacitor body 51 is less likely to be damaged.

Figure 18A:
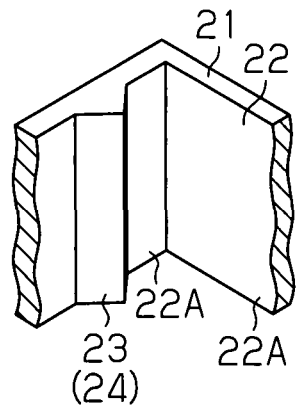
FIG. 18A is a schematic perspective view illustrating a projection in a fourth modification.
Figure 18B:
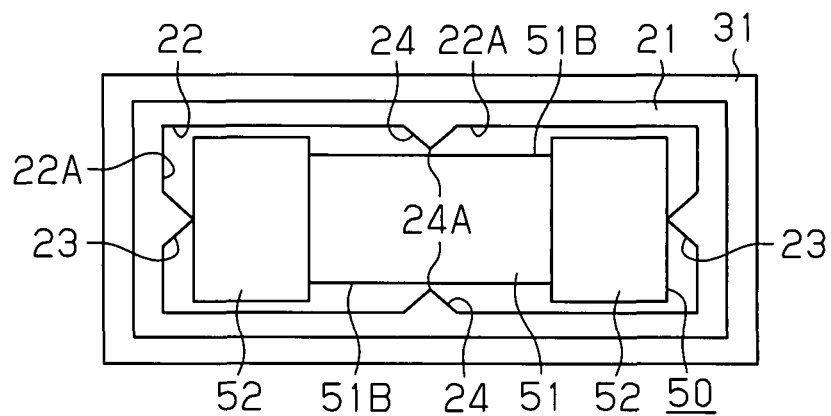
FIG. 18B is a partially enlarged plan view of a core substrate in the fourth modification.

Each of the projections 23 and 24 may project from the entire surface of the corresponding wall in the through hole 22 like in the above embodiment. Alternatively, each of the projections 23 and 24 may project from a portion of the corresponding wall in the through hole 22. For example, as illustrated in FIGS. 18A and 18B, each of the projections 23 and 24 may project into the through hole 22 from a portion of a corresponding wall 22A of the through hole 22. In the example illustrated in FIG. 18B, each projection 23 projects toward the corresponding connection terminal 52 from a portion of the corresponding wall 22A in the through hole 22 near the center of the short side of the through hole 22. Each projection 24 projects toward the corresponding side surface 51B of the capacitor body 51 from a portion of the corresponding through hole 22.

Figure 18C:
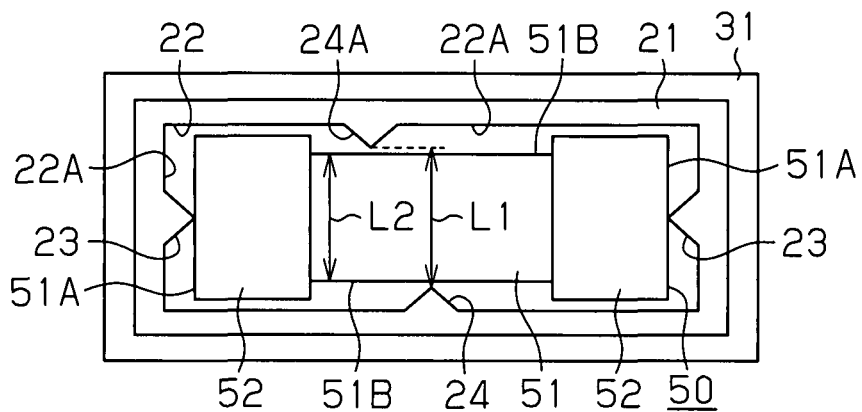
FIG. 18C is a partially enlarged plan view of a core substrate in a fifth modification that includes the projection of FIG. 18A.

The distal ends 24A (or distal end surfaces 24B) of the two projections 24 do not have to face each other like in the above embodiment and modifications. For example, as illustrated in FIG. 18C, the distal ends 24A of the two projections 24 may be formed on the opposing walls 22A of the through hole 22 at positions shifted from each other in the longitudinal direction of the through hole 22. Each projection 24 projects toward the corresponding exposed side surface 51B of the capacitor body 51 that is not covered by the connection terminal 52. The distance L1 in the lateral direction of the capacitor body 51 (i.e., distance in a direction parallel to the side surface 51A) between the distal ends 24A of the two projections 24 is set to be longer than the distance L2 of the capacitor body 51 and shorter than the length of the diagonal line, which is the longest distance L3 (FIG. 6) between two points, in a cross-section orthogonal to the longitudinal direction of the capacitor body 51.

Alternatively, the modification illustrated in FIG. 18C may further include a plurality of projections 24 on each wall 22A of the through hole 22 facing the side surface 51B of the capacitor body 51. In this case, the distance in a direction parallel to the side surface 51A of the distance between the distal ends 24A of the two projections 24 formed on the opposing walls 22A is set to be longer than the distance L2 of the capacitor body 51 and shorter than the length of the diagonal line, which is the longest length L3 between two points (FIG. 6), in the cross-section orthogonal to the longitudinal direction of the capacitor body 51 (condition 1). The advantages of the above embodiment may be obtained if at least two of the projections 24 satisfy condition 1. In other words, the same advantages as the above embodiment may be obtained if the narrowest distance between the distal ends 24A of the two projections 24 in a direction parallel to the side surfaces 51A satisfies condition 1.

In the above embodiment, the distal ends of the projections 23 and 24 continuously extend from the upper surface 21A toward the lower surface 21B of the core substrate 21. Instead, for example, the projections 23 and 24 may be formed only on a limited portion of the core substrate 21 in the thicknesswise direction of the core substrate 21.

Figure 19:
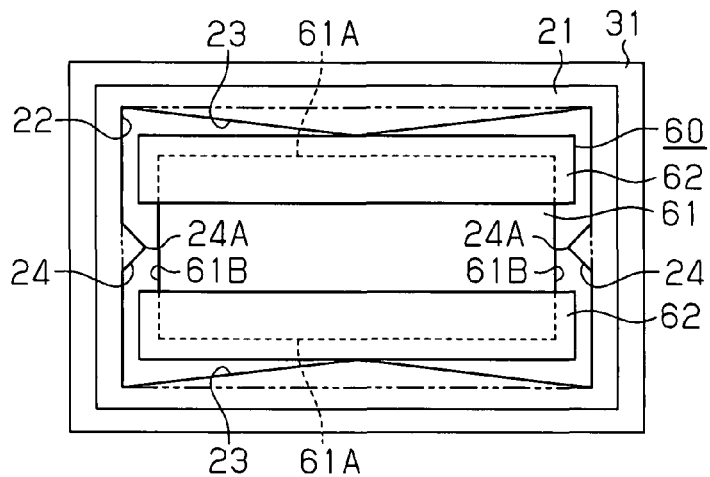
FIG. 19 is a partially enlarged plan view of a core substrate in a sixth modification.

The chip capacitor 50 does not have to include the connection terminals 52 on the two longitudinal ends of the capacitor body 51. For example, a chip capacitor 60 illustrated in FIG. 19 includes a connection terminal 62 on each of the lateral ends of the capacitor body 61 parallel to the longitudinal direction. In this example, the entire surface of each lateral end surface 61A (first side surface) of the capacitor body 61 is covered by the corresponding connection terminal 62. An end surface (second side surface 61B) traversing the longitudinal direction of the capacitor body 61 includes an exposed part that is not covered by the connection terminal 62. Each projection 23 is formed on the wall of the through hole 22 facing the side surface of the connection terminal 62 covering the corresponding lateral end surface 61A (first side surface) of the capacitor body 61. Each projection 24 is formed on the wall of the through hole 22 facing the second side surface 61B of the capacitor body 61. Each projection 24 projects toward the exposed portion of the corresponding second side surface 61B of the capacitor body 61 that is not covered by the connection terminal 62. The distance between the distal ends 24A of the two projections 24 is longer than the width of the capacitor body 61 (i.e., distance between the second side surfaces 61B of the capacitor body 61) and shorter than the length of the diagonal line of the end surface 61A. The distance between the distal ends 24A of the two projections 24 in the example of FIG. 19 is the distance between the distal ends 24A of the projection 24 in the longitudinal direction of the capacitor body 61 (i.e., distance in a direction parallel to the end surfaces 61A). Such a structure obtains advantages (1) to (4) of the above embodiment.

Figure 20A:
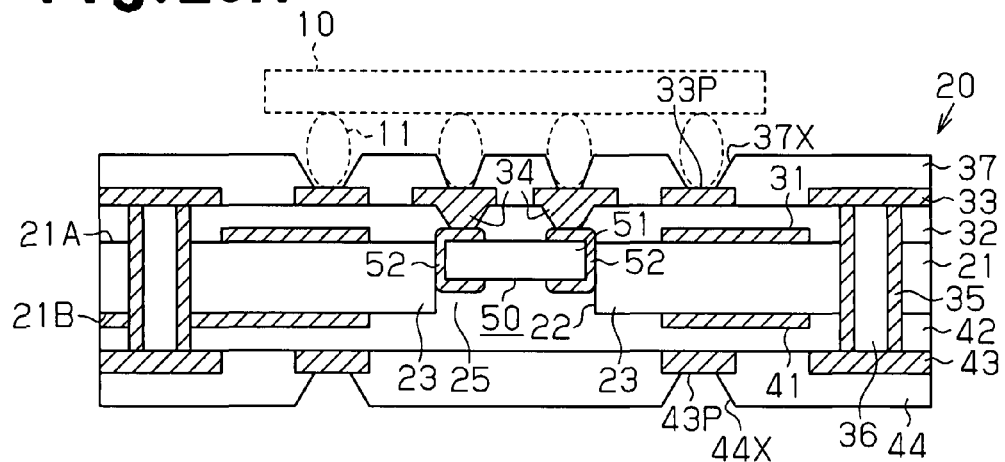
FIGS. 20A and 20B are schematic cross-sectional views illustrating a wiring substrate in a seventh modification.
Figure 20B:
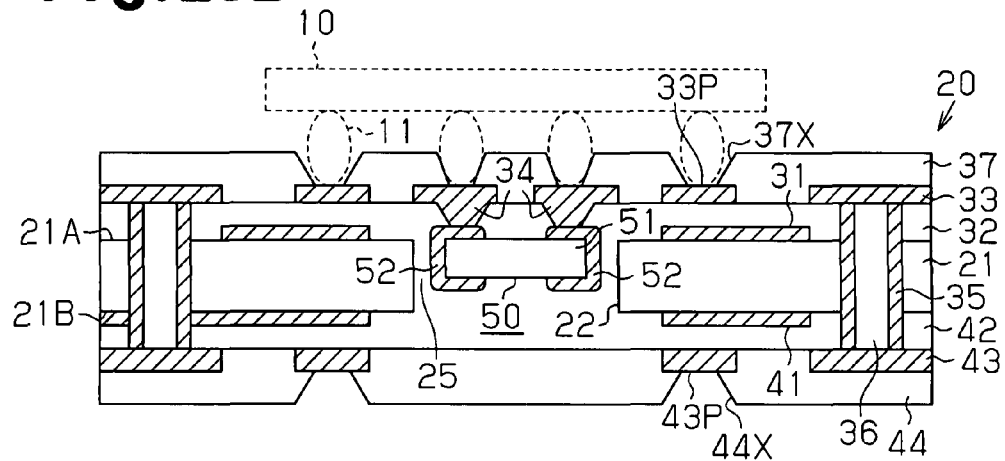

In the above embodiment, the upper surface of each connection terminal 52 is substantially flush with the upper surface 21A of the core substrate 21. Instead, for example, as illustrated in FIGS. 20A and 20B, the upper surface of the connection terminal 52 may be substantially flush with the upper surface of the wiring layer 31.

In the embodiment described above, the capacitor body 51 has a tetragonal shape. Instead, the capacitor body 51 may have a non-tetragonal shape such as a square shape or a polygonal shape like a pentagon.

The shape of the cross-section of the capacitor body 51 (periphery of the side surface 51A) orthogonal to the longitudinal direction in the above embodiment does not have to be tetragonal. For example, the shape of the cross-section orthogonal to the longitudinal direction of the capacitor body 51 may have a non-tetragonal shape such as a square shape, a trapezoidal shape, or a polygonal shape like a pentagon. In any case, the distance L1 between the distal ends 24A of the projections 24 is set to be shorter than the distance between two points on the periphery of the side surface 51A where the linear distance is farthest.

Figure 21A:
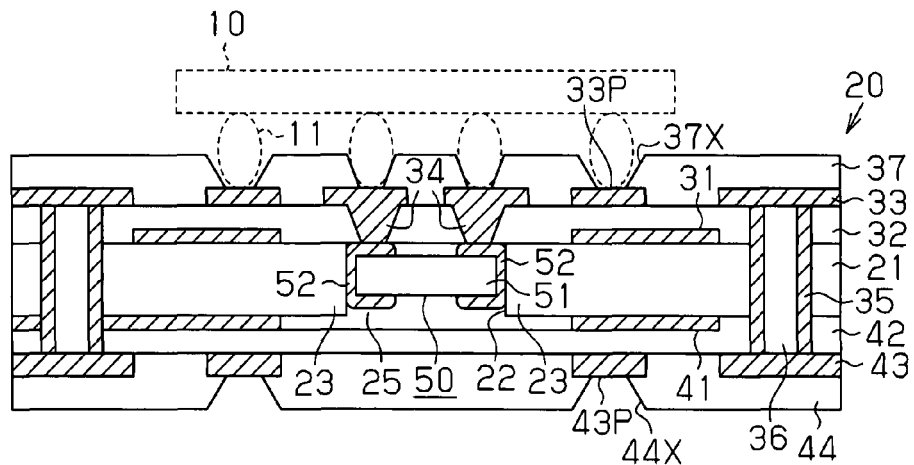
FIGS. 21A and 21B are schematic cross-sectional views illustrating a wiring substrate in an eighth modification.
Figure 21B:
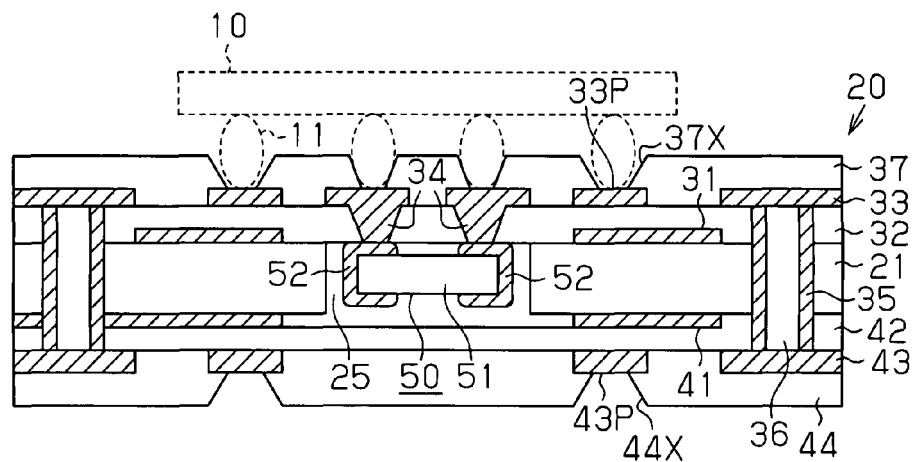

As illustrated in FIGS. 21A and 21B, the insulating material 25 filled in the through hole 22 and the insulating layers 32 and 42 may be formed in different steps. Furthermore, the insulating material 25 filled in the through hole 22 and the insulating layers 32 and 42 may be formed from different materials.

The number of wiring layers and the number of insulating layers in the embodiment described above may be changed.

In the wiring substrate 20 of the embodiment described above, the insulating material 36 is filled in the through hole 35. However, the through hole 35 may be a filled via through hole filled with a conductive material (e.g., copper).

In the above embodiment, the electronic component accommodated in the through hole 22 is not limited to the chip capacitor 50 including two connection terminals 52. The electronic component may be a capacitor including three or more connection terminals 52, a chip resistor, an inductor, a semiconductor device (LSI), or the like.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
   an electronic component including a main body and a plurality of connection terminals, wherein the main body includes first side surfaces that are opposed to each other at two end surfaces in an x-direction of the main body, second side surfaces that are opposed to each other at two end surfaces in a y-direction of the main body orthogonal to the x-direction, and third side surfaces that are opposed to each other at two end surfaces in a z-direction of the main body orthogonal to both of the x-direction and the y-direction, and the connection terminals respectively cover the first side surfaces;
   a core substrate including
      a first surface,
      a second surface opposite to the first surface,
      a through hole in which the electronic component is arranged, the through hole extending from the first surface to the second surface,
      a plurality of first projections respectively projecting from walls of the through hole facing the first side surfaces of the main body toward the first side surfaces of the main body, wherein each of the first projections includes a distal end that contacts a corresponding one of the connection terminals, and
      a plurality of second projections projecting from walls of the through hole facing the second side surfaces of the main body toward the second side surfaces of the main body; and
   an insulating material filled between the electronic component and the walls of the through hole,
   wherein opposing ones of the second projections respectively include distal ends that are spaced apart by a distance that is longer than a distance between the second side surfaces and shorter than a distance between two farthest points on a periphery of each first side surface.

2. The wiring substrate according to claim 1, wherein each of the first projections and each of the second projections continuously extend from the first surface toward the second surface in the core substrate.

3. The wiring substrate according to claim 1, wherein
   the distal end of each of the first projection faces one of the connection terminals; and
   a distance between the distal end of each of the first projections and a corresponding one of the connection terminals gradually varies from the first surface toward the second surface.

4. The wiring substrate according to claim 1, wherein each of the second projection has a trapezoidal shape.

5. The wiring substrate according to claim 1, wherein the distal end of each of the second projections is curved.

6. The wiring substrate according to claim 1, wherein
   the main body of the electronic component is a box-shaped and elongated in a longitudinal direction;
   the first side surfaces are two end surfaces of the main body in the longitudinal direction;
   the second side surfaces are opposing two end surfaces of the main body in a lateral direction, which is orthogonal to the longitudinal direction; and
   the connection terminals cover the first side surfaces of the main body entirely.

7. The wiring substrate according to claim 1, wherein the electronic component is a chip capacitor.

8. The wiring substrate according to claim 1, further comprising:
   a first insulating layer that covers the first surface of the core substrate and the electronic component; and
   a second insulating layer that covers the second surface of the core substrate and the electronic component, wherein
   the first insulating layer and the second insulating layer are formed from the same thermosetting resin, and the insulating material is formed by filling the same thermosetting resin as the first insulating layer and the second insulating layer between the electronic component and the walls of the through hole when the first insulating layer and the second insulating layer are heated and pressurized for formation.

9. A wiring substrate comprising:

a core substrate including a first surface, a second surface, and an elongated accommodation compartment having an opening in the first surface and an opening in the second surface, wherein the accommodation compartment includes a plurality of first projections, which project in a longitudinal direction of the accommodation compartment and a plurality of second projections, which project in a lateral direction that is orthogonal to the longitudinal direction, and the first projections and the second projections each have a distal end in the accommodation compartment;

an electronic component arranged in the accommodation compartment and supported by the first projections; and an insulating material that fills the accommodation compartment to enclose the electronic component, wherein the electronic component includes connection terminals, which are respectively engaged with the distal ends of the first projections, and a body, which is arranged between the connection terminals, a minimum interval between the distal ends of the second projections in the lateral direction is set to restrict rotation of the electronic component about a hypothetical rotation axis connecting the distal ends of the first projections, and the distal end of at least one of the second projections is spaced apart from the body of the electronic component by a regulated distance.

10. The wiring substrate according to claim 9, wherein the distal ends of the second projections are spaced apart from the body of the electronic component by a regulated distance.

11. The wiring substrate according to claim 9, wherein the distal end of each of the first projections is a ridge elongated between the openings of the accommodation compartment.

12. The wiring substrate according to claim 9, wherein the distal ends of the second projections are arranged along the same line that is orthogonal to the longitudinal direction.

13. The wiring substrate according to claim 9, wherein the distal ends of the second projections are shifted from each other in the longitudinal direction.

* * * * *